United States Patent [19]
Jastrzebski et al.

[11] Patent Number: 4,566,025
[45] Date of Patent: Jan. 21, 1986

[54] CMOS STRUCTURE INCORPORATING VERTICAL IGFETS

[75] Inventors: Lubomir L. Jastrzebski, Plainsboro; Alfred C. Ipri, Princeton, both of N.J.

[73] Assignee: RCA Corporation, Princeton, N.J.

[21] Appl. No.: 503,044

[22] Filed: Jun. 10, 1983

[30] Foreign Application Priority Data

Jun. 24, 1982 [GB] United Kingdom ............... 8218286

[51] Int. Cl.⁴ ............... H01C 27/02; H01C 29/78; H01C 27/01
[52] U.S. Cl. ............... 357/42; 357/23.4; 357/23.7; 357/4; 357/23.14; 365/182; 307/279
[58] Field of Search ............... 357/42, 23.4, 56, 41, 357/55, 23.14, 59, 23 TF, 23.7, 4; 29/576 B, 576 T; 307/279, 304; 365/156, 181, 182, 188

[56] References Cited
U.S. PATENT DOCUMENTS

| 3,518,509 | 6/1970 | Cullis | 357/23 VD |
| 3,564,358 | 2/1971 | Hahnlein | 357/4 |
| 3,859,716 | 1/1975 | Tihanyi | 357/42 |
| 3,893,155 | 7/1975 | Ogiue | 357/23 VD |
| 4,262,340 | 4/1981 | Sasaki et al. | 357/42 |
| 4,412,868 | 11/1983 | Brown | 357/42 |
| 4,487,639 | 12/1984 | Lam | 357/42 |

FOREIGN PATENT DOCUMENTS

| 0094670 | 7/1981 | Japan | 357/42 |
| 0056961 | 4/1982 | Japan | 357/42 |
| 0056327 | 4/1983 | Japan | 29/576 T |

OTHER PUBLICATIONS

IEEE Electron Device Letters, Jun. 1980, pp. 117, 118 by Gibbons.

Primary Examiner—Andrew J. James
Assistant Examiner—Mark Prenty
Attorney, Agent, or Firm—Birgit E. Morris; Donald S. Cohen; Kenneth R. Glick

[57] ABSTRACT

A CMOS device incorporates a plurality of interconnected vertical IGFETs on a substrate. An insulated gate electrode is located on the substrate surface and a pair of monocrystalline silicon regions extend from the substrate surface such that each of the monocrystalline silicon regions is contiguous with a portion of the insulated gate electrode. One of the monocrystalline regions has a body region of first conductivity type and the other monocrystalline region has a body region of second conductivity type. Both of the body regions are located with respect to the insulated gate electrode such that an inversion channel can selectively be created in one of the body regions by applying a predetermined voltage to the insulated gate electrode.

12 Claims, 8 Drawing Figures

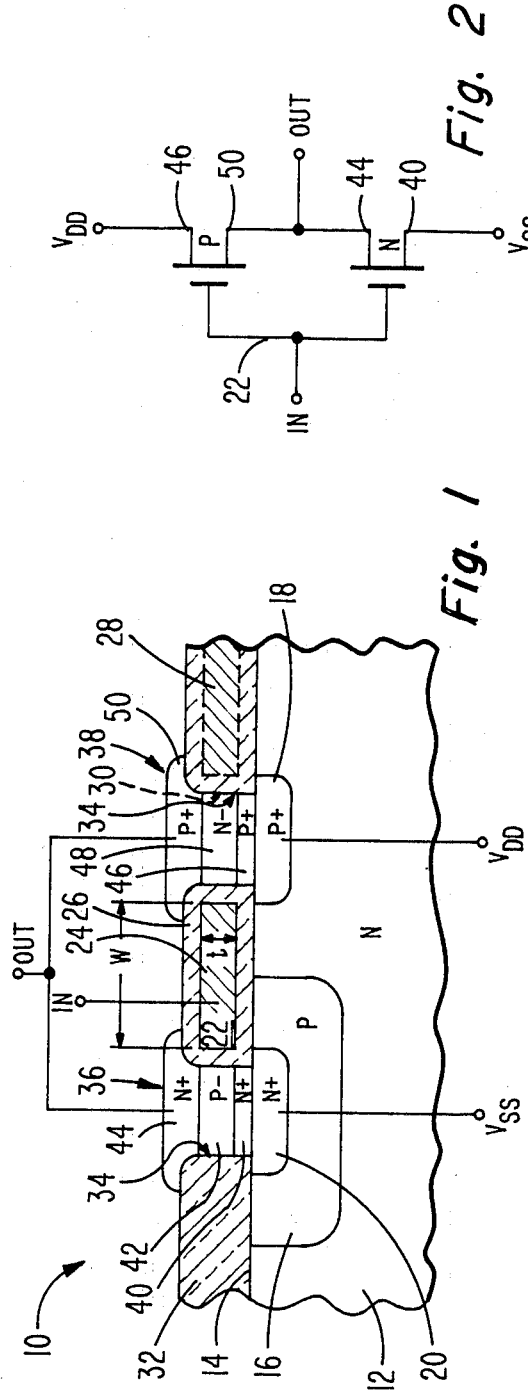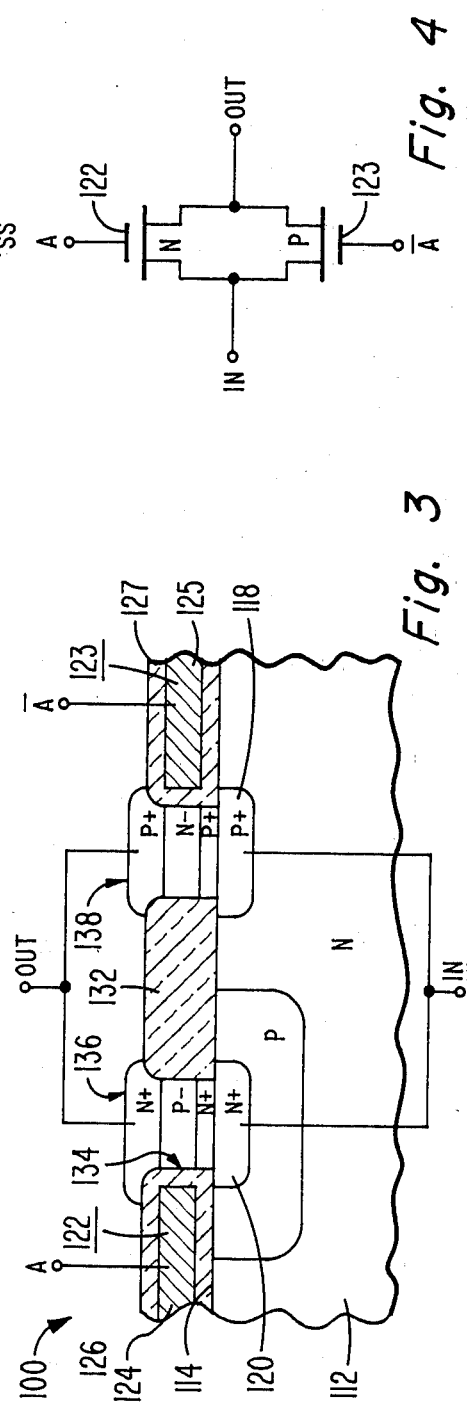

CMOS STRUCTURE INCORPORATING VERTICAL IGFETS

The present invention relates to an integrated circuit device which incorporates a plurality of interconnected vertical IGFETs on a substrate. More particularly, the invention relates to a Complementary Symmetry Metal Oxide Semiconductor (CMOS) structure wherein a vertical N-channel IGFET shares an oxide-insulated gate electrode with a vertical P-channel IGFET.

BACKGROUND OF THE INVENTION

A vertical IGFET, as defined herein, refers to a transistor wherein current flow is regulated along a direction which is perpendicular to the major surfaces of the substrate on which the transistor is disposed. The source, body and drain regions are in an overlying relationship to one another, and an insulated gate electrode is contiguous with at least a portion of the body region. When the insulated gate electrode is appropriately electrically biased, an inversion channel is formed between the source and drain regions in that portion of the body region adjacent thereto. The fundamental structure for such a vertical IGFET device is disclosed in copending U.S. patent application Ser. No. 489,307, SELF-ALIGNED VERTICAL IGFET AND METHOD FOR FABRICATING SAME, L. L. Jastrzebski et al., filed Apr. 28, 1983 and now U.S. Pat. No. 4530149.

The fundamental structure includes a substrate having a monocrystalline portion at a major surface thereof and an insulated gate electrode disposed on the substrate surface. The insulated gate electrode, which comprises a conductive gate electrode which is substantially surrounded by gate insulation, includes an aperture to an area of the monocrystalline portion. A monocrystalline silicon region extends from the substrate within the aperture to a height substantially equal to that of the insulated gate electrode. That part of the monocrystalline silicon region within the aperture and in opposition to the conductive gate electrode is doped so as to form the body region of the FET. Thus, the thickness of the conductive gate electrode determines gate length. Parts of the monocrystalline silicon region underlying and overlying the body region are oppositely doped so as to form source and drain regions.

Such vertical IGFETs can be fabricated utilizing the epitaxial lateral overgrowth (ELO) fabrication technique disclosed in copending U.S. patent application Ser. No. 338,958, METHOD FOR GROWING MONOCRYSTALLINE SILICON ON A MASK LAYER, J. F. Corboy et al., filed Jan. 12, 1982 and now abandoned. Basically, the ELO process involves a repetitious, two phase, deposition/etch cycle whereby monocrystalline silicon is grown from a monocrystalline surface which is exposed within the aperture of an overlying mask.

The structure of a CMOS device couples an N-channel IGFET with a P-channel IGFET by a common gate electrode. The gate electrode in a conventional CMOS device is insulated by an oxide layer. Although the basic principles of a CMOS device apply to the structure of the present invention, it should be recognized that the present invention does not limit the gate insulation to be oxide.

SUMMARY OF THE INVENTION

A vertically integrated CMOS structure incorporating a plurality of interconnected vertical IGFETs is disclosed. An insulated gate electrode, comprising an electrode and insulation, is disposed on the surface of a substrate. A pair of monocrystalline silicon regions, contiguous with the insulated gate electrode, extend from the substrate surface to a height substantially equal to that of the insulated gate electrode. One monocrystalline region has a body region of first conductivity type and the other monocrystalline region has a body region of second conductivity type, and both of the body regions are disposed in opposition to the electrode of the insulated gate electrode. When a predetermined voltage is applied to the electrode, an inversion channel is selectively created in one of the two body regions.

BRIEF DESCRIPTION OF THE DRAWING

FIG. 1 is a sectional view of a vertically integrated CMOS inverter in accordance with the present invention.

FIG. 2 is a schematic representation of the inverter of FIG. 1.

FIG. 3 is a sectional view of a vertically integrated transmission gate.

FIG. 4 is a schematic representation of the transmission gate of FIG. 3.

DETAILED DESCRIPTION

Figure 6:
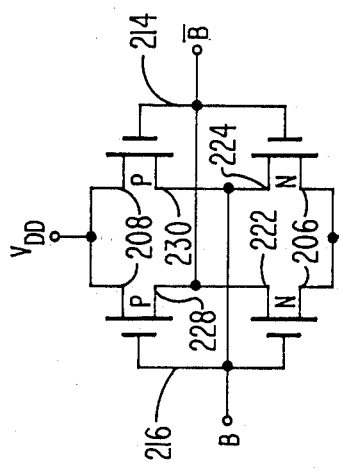
FIG. 6 is a schematic representation of the basic storage element of FIG. 5.
Figure 8:
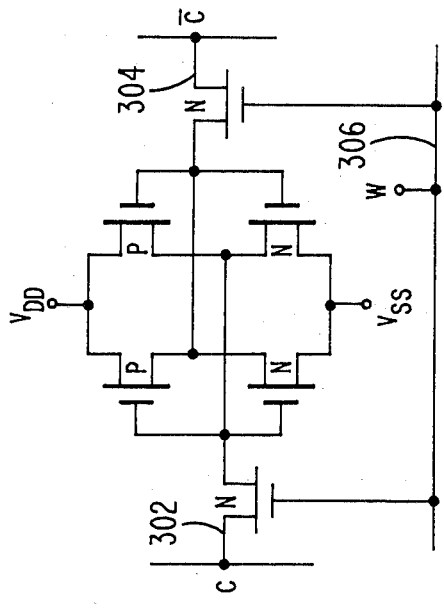
FIG. 8 is a schematic representation of the memory cell of FIG. 7.

FIG. 1 illustrates the structure of a basic CMOS inverter 10 in accordance with the present invention. As shown, the inverter 10 is fabricated on a bulk, monocrystalline silicon substrate 12, although, as will be discussed subsequently, a substantially insulating substrate can alternatively be used. The substrate 12 is of N type material and has a major surface 14. Extending into the substrate from the major surface 14 is a conventional P type isolation well 16 and a P+ type source/drain contact region 18 spaced therefrom. An N+ type source/drain contact region 20 extends into the substrate from the surface 14 within the boundaries of the isolation well 16.

An insulated gate electrode, hereinafter referred to as a gate, is disposed on the major surface 14 as indicated at 22. The gate 22 comprises an electrode 24 which is substantially surrounded by gate insulation 26. The electrode 24 might comprise doped polycrystalline silicon, and the insulation 26 might be silicon dioxide, silicon nitride, or some combination of silicon dioxide and silicon nitride. The gate 22 can have a variety of geometric shapes. In the illustrated embodiment it is shaped as a substantially rectangular finger. The finger has a major axis extending perpendicularly to the plane of the drawing, a width w, and a thickness t.

Alternatively, the configuration of the gate 22 can include an aperture or a plurality of apertures to the substrate surface 14. An example of such a structure is shown in phantom at 28 in FIG. 1. The phantom portion 28 is continuous with the electrode 24 and is also surrounded by gate insulation so as to define an aperture at 30. As illustrated, the aperture 30 exposes the P+ type contact region 18 at the substrate surface 14. Such an apertured gate structure might alternatively or additionally expose the N+ type contact region 20 at the surface 14.

In the illustrated embodiment, field insulation 32 surrounds the finger-shaped gate 22. The field insulation 32 extends from the substrate surface 14 to a height substantially equal to that of the gate 22 and it might comprise, for example, silicon dioxide, silicon nitride, or a combination of silicon nitride and silicon dioxide. The field insulation 32 is contiguous with the gate insulation 26 so as to define an aperture 34 to each of the contact regions 18 and 20. The aperture 34, defined by the gate 22 and field insulation 32, may be identical in configuration to the previously described aperture 30 created by the alternative gate configuration.

First and second monocrystalline silicon regions, 36 and 38 respectively, extend from the N+ and P+ type source/drain contact regions 20 and 18, respectively. The monocrystalline silicon regions substantially fill the apertures 34, although they may extend to a height greater than that of the apertures 34, as shown. An N-channel vertical IGFET is formed in the first monocrystalline silicon region 36 and a P-channel vertical IGFET is formed in the second monocrystalline silicon region 38.

That part of the monocrystalline silicon region 36 which is adjacent to the N+ type contact region 20 is also of N+ type material and forms an underlying source/drain region 40 of the N-channel device. The thickness of the underlying source/drain region 40 is approximately equal to the thickness of the gate insulation 26 which underlies the electrode 24. Overlying the source/drain region 40 and forming a PN junction therewith is a P− type body region 42. Overlying the body region 42 and forming a PN junction therewith is an N+ type drain/source region 44. Optimally, the body region 42 is disposed in direct opposition to the electrode 24, thus, the thickness of the body region 42 is approximately equal to t, the thickness of the electrode 24.

The second monocrystalline silicon region 38 is substantially similar in construction but, of opposite conductivity type. An underlying P+ type source/drain region 46 is adjacent to the P+ contact region 18, and is also of a thickness approximately equal to that of the gate insulation 26 which underlies the electrode 24. Overlying the P+ type source/drain region 46 and forming a PN junction therewith is an N− type body region 48, and overlying the body region 48 and forming a PN junction therewith a P+ type drain/source region 50. Again, the body region is optimally disposed in direct opposition to the electrode 24 portion of the gate 22, and has a thickness t.

External connections to the inverter 10 are shown schematically in FIG. 1 as well as in FIG. 2. High level voltage $V_{DD}$ and low level voltage $V_{SS}$ are connected, respectively, to the P+ type contact region 18 and N+ type contact region 20. Input to the device is made to the gate 22. A predetermined positive input voltage creates an inversion channel in the N-channel device and a predetermined negative input voltage creates an inversion channel in the P-channel device. Output from the inverter is provided from the N+ type drain/source region 44 and P+ type drain/source region 50. Although these regions can be independently externally connected to an output terminal as shown, alternative structures are equally attractive. For example, the output terminal can be connected to a metallization layer which overlies the N+ type drain/source region 44, the P+ type drain/source region 50 and the gate 22 therebetween.

Illustrated in FIG. 3 is a transmission gate 100. In that there are many similarities in stucture to that of the inverter 10, analogous reference numerals are used to represent analogous features (e.g. substrate 112 of the transmission gate is analogous to substrate 12 of the inverter). As with the inverter 10, the transmission gate 100 incorporates first and second monocrystalline silicon regions 136 and 138 which extend, respectively, from N+ type and P+ type source/drain contact regions 120 and 118. Disposed on the major surface 114 between the first and second monocrystalline silicon regions 136 and 138 is field insulation 132.

Rather than the single gate structure of the inverter 10, in the transmission gate 100, first and second gates 122 and 123, comprising first and second electrodes 124 and 125 surrounded by gate insulation 126 and 127 are contiguous with the first and second monocrystalline silicon regions 136 and 138. The gate insulation 126 and 127 from each of the gates is continuous with the field insulation 132 so as to define the apertures 134 in which the monocrystalline silicon regions are disposed. The first and second gates are independently biased as shown at A and A.

In addition to having a pair of gates which can be independently biased, the interconnection of the transmission gate 100 differs from that of the inverter 10 in that the source/drain contact regions 118 and 120 are shorted together and connected to a device input terminal. The device output terminal is connected in a similar fashion to that of the inverter 10. Schematically, the structure is illustrated in FIG. 4.

Figure 5:
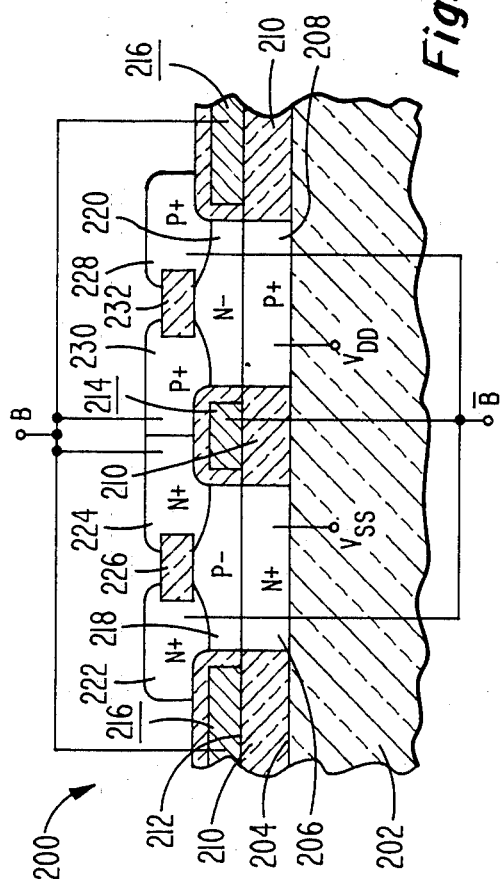
FIG. 5 is a sectional view of a storage element, incorporating two cross coupled inverters, in accordance with the present invention.

Illustrated in FIG. 5 is a pair of cross-coupled inverters, hereinafter storage element 200, in accordance with the present invention. The storage element 200 is fabricated on an insulating wafer 202 of a material such as sapphire. The wafer 202 has a major surface 204 on which an N+ type source/drain region 206 and a P+ type source/drain region 208 are disposed. Both of these source/drain regions are monocrystalline silicon, and they are separated from each other by an isolation oxide 210. In the preferred embodiment the isolation oxide 210 is substantially coplanar with both source/drain regions and it surrounds both source/drain regions on the surface 204. The substantially coplanar surface of source/drain regions 204 and 206 and isolation oxide 210 is identified at 212. Thus, the wafer 202, source/drain regions 204 and 206, and surface 212 of device 200 are substantially functionally equivalent to the substrate 12, source/drain contact regions 20 and 18, and surface 14 of the device 10, and can be used interchangeably in the present invention.

In an exemplary configuration for storage element 200, the two source/drain regions 206 and 208 are arranged as parallel fingers on the surface 204. The isolation oxide 210 is disposed between the two fingers, and it surrounds the two fingers in a frame-like manner. Disposed on the isolation oxide 210 is a first gate 214 and a second gate 216. In the exemplary configuration, the first gate 214 is disposed over that portion of the isolation oxide 210 which is located between the source/drain region fingers 206 and 208. The second gate 216 is disposed on the surrounding, frame-like portion of the isolation oxide 210. As with the gate of the inverter 10, the gates 214 and 216 each comprise an electrode of particular thickness which is substantially surrounded by a gate insulation.

Extending from the N+ type source/drain region 206 is a P− type monocrystalline silicon body region 218, and extending from the P+ type source/drain region 208 is an N− type monocrystalline silicon body region 220. In addition to forming a PN junction with its respective underlying source/drain region, each of the body regions 218 and 220 is contiguous with both the first gate 214 and second gate 216. As with the previously described structures, the thickness of the body regions 218 and 220 is substantially equal to the thickness of the electrode portion of the gates 214 and 216.

First and second N+ type source/drain regions, 222 and 224 respectively, overlie the P− type body region 218 and form PN junctions therewith. These source/drain regions will hereinafter be referred to as first overlying N+ region 222 and second overlying N+ region 224. A source/drain isolation layer 226 of, for example, silicon dioxide, overlies the P− type body region 218 and serves to isolate the first overlying N+ region 222 from the second overlying N+ region 224. Thus, the first overlying N+ region 222, the P− type body region 218, and the N+ type source/drain region 206 form an N-channel FET which is controlled by the second gate 216. The second overlying N+ region 224, the P− type body region 218, and the source/drain region 206, form an N-channel FET which is controlled by the first gate 214. In an analogous fashion, two P-channel FETs are formed in conjunction with the N− type body region 220 and the P+ source/drain region 208. First and second overlying P+ type source/drain regions 228 and 230 respectively, overlie the N− type body region 220 and form PN junctions therewith. Again, a source/drain isolation layer 232 isolates the two overlying P+ regions 228 and 230 from each other.

As illustrated, the second overlying N+ region 224 and the second overlying P+ region 230 can optionally be adjacent to one another. As indicated in FIGS. 5 and 6, these two regions are electrically shorted to one another as well as to the second gate 216 and are connected to an input/output terminal B. In a similar fashion, an input/output terminal $\overline{B}$ is connected to the first overlying N+ region 222, the first overlying P+ region 228, and the first gate 214. Low level voltage $V_{SS}$ is connected to the N+ type source/drain region 206 and high level voltage $V_{DD}$ is connected to the P+ type source/drain region 208.

Figure 7:
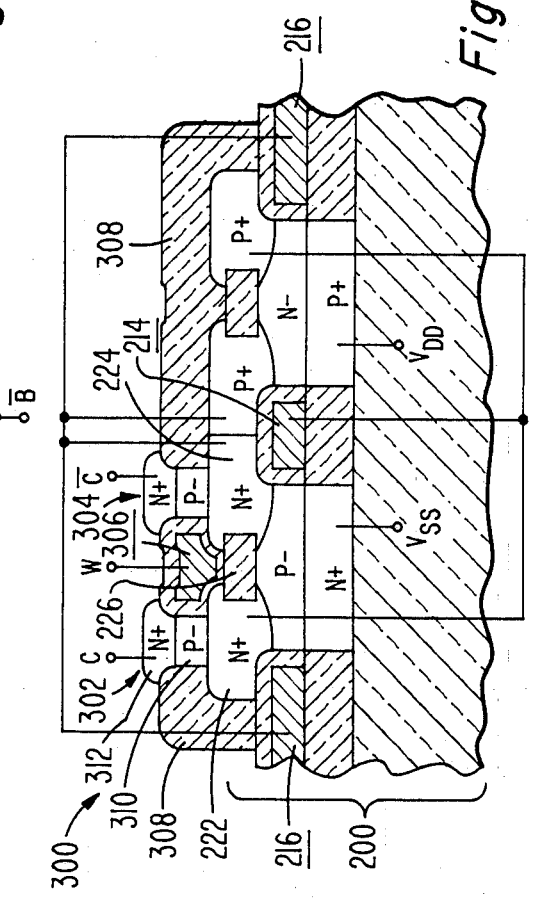
FIG. 7 is an exemplary memory cell structure in accordance with the present invention. The memory cell incorporates two cross-coupled inverters which are accessed by a pair of access transistors.

Utilizing the storage element 200 as a foundation, a pair of vertical access transistors can readily be added so as to produce the memory cell 300 illustrated in FIG. 7. As shown, first and second vertical N-channel access transistors, 302 and 304 respectively, are each disposed in series with one of the N-channel FETs of the storage element 200. The first and second overlying N+ regions 222 and 224 of the storage element 200 serve as source/drain regions of the first and second access transistors 302 and 304. An access transistor gate 306 is disposed on the source/drain isolation layer 226.

An overlying insulation 308 covers the overlying N+ regions 222 and 224 and is spaced from the access transistor gate 306 so as to define the geometry of the access transistors 302 and 304. Monocrystalline silicon extends from the overlying N+ regions 222 and 224 and is appropriately doped so that each has a P− type body region 310 in opposition to the electrode portion of the access transistor gate 306 and an N+ type source/drain uppermost region 312.

The uppermost N+ type source/drain region 312 of the first access transistor 302 is connected to a bit line as identified at C. The uppermost N+ type source/drain region 312 of the second access transistor 304 is electrically connected to a bit line identified at $\overline{C}$. The access transistor gate 306, which controls both access transistors 302 and 304, is connected to a word line as indicated at W. A low level voltage supply $V_{SS}$ and high level voltage supply $V_{DD}$ are connected to the memory cell 300 as they were connected to the storage element 200. Interconnections between the overlying N+ and P+ source/drain regions 222, 224, 228 and 230 and their respective gates 214 and 216 are the same as they were in the storage element 200. However, external connections to the first and second gates 214 and 216, as shown at B and $\overline{B}$ in FIG. 5, are not made in the memory cell 300.

As previously indicated, the various devices disclosed herein can be fabricated utilizing conventional processing techniques which incorporate the ELO process for selective epitaxial deposition. An exemplary processing sequence to fabricate the inverter 10 is:

(1) Form the gate and aperture on the substrate surface.
(2) Dope the source/drain contact regions (when a bulk silicon substrate is used).
(3) Grow and dope the monocrystalline silicon regions using the ELO technique.
(4) Provide interconnections by conventional processing techniques.

In the storage element 200, the second gate as well as the first and second overlying source/drain regions can be fabricated by conventional semiconductor processing techniques. The vertical access transistors used in the memory cell 300 can also be fabricated by conventional processing and the ELO techniques.

The structure of the present invention provide several significant advantages over conventional CMOS structures. The use of vertical IGFETs, wherein channel length is a function of gate electrode thickness, intrinsically provides a device with greater packing density. By vertically integrating these vertical IGFETs, as for example in the memory cell 300, an even further increase in packing density can be realized. Furthermore, the structures disclosed herein can be fabricated utilizing conventional semiconductor processing techniques, as well as self-aligned processing. It should further be recognized by one skilled in the art, that variations to the disclosed embodiments can be made without departing from the scope of the invention as enumerated in the claims.

What is claimed is:
1. An integrated circuit device incorporating a plurality of interconnected vertical IGFETs on a bulk silicon substrate, comprising:
    an insulated gate electrode disposed on a surface of the substrate;
    the substrate including a first substrate portion of second conductivity type and a second substrate portion of first conductivity type disposed at said surface, said first and second substrate portions being electrically isolated from each other;

first and second monocrystalline silicon regions extending, respectively, from said first and second substrate portions, said monocrystalline silicon regions each being contiguous with a part of the insulated gate electrode;

the first monocrystalline silicon region having a body region of first conductivity type, and the second monocrystalline silicon region having a body region of second conductivity type, such that a predetermined voltage applied to the insulated gate electrode selectively creates an inversion channel in one of the body regions, said inversion channel having a length which is perpendicular to the substrate surface;

a second insulated gate electrode disposed on the substrate surface, the second insulated gate electrode being contiguous with the body region of the first monocrystalline silicon region and the body region of the second monocrystalline silicon region;

a source/drain region underlying each body region and of opposite conductivity type thereto; and first and second source/drain regions overlying each body region, said first and second overlying source/drain regions being isolated from each other and being of opposite conductivity type to the body region thereunder.

2. An integrated circuit device incorporating a plurality of interconnected vertical IGFETs on a substrate, comprising:

an insulating wafer having a major surface on which first and second monocrystalline substrate portions are disposed, said monocrystalline substrate portions being separated from each other by an isolation oxide which is disposed on the major surface of said insulating wafer, and being substantially coplanar with said isolation oxide so as to yield a substrate surface;

an insulated gate electrode disposed on the substrate surface;

first and second monocrystalline silicon regions extending, respectively, from the first and second substrate portions, said monocrystalline silicon regions each being contiguous with a part of the insulated gate electrode;

the first monocrystalline silicon region having a body region of first conductivity type, and the second monocrystalline silicon region having a body region of second conductivity type, such that a predetermined voltage applied to the insulated gate electrode selectively creates an inversion channel in one of the body regions, said inversion channel having a length which is perpendicular to the substrate surface;

a second insulated gate electrode disposed on the substrate surface, the second insulated gate electrode being contiguous with the body region of the first monocrystalline silicon region and the body region of the second monocrystalline silicon region;

a source/drain region underlying each body region and of opposite conductivity type thereto; and first and second source/drain regions overlying each body region, said first and second overlying source/drain regions being isolated from each other and being of opposite conductivity type to the body region thereunder.

3. A device in accordance with claim 1, further comprising:

means for connecting a source of predetermined voltage to the underlying source/drain region of first conductivity type;

means for connecting a source of relatively lower voltage to the underlying source/drain region of second conductivity type;

an input/output terminal, which connects the first source/drain region which overlies the second conductivity type body region to the first source/drain region which overlies the first conductivity type body region to the first insulated gate electrode; and a second input/output terminal, which connects the second source/drain region which overlies the second conductivity type body region to the second source/drain region which overlies the first conductivity type body region to the second insulated gate electrode.

4. A device in accordance with claim 1, further comprising:

means for connecting a source of predetermined voltage to the underlying source/drain region of first conductivity type;

means for connecting a source of relatively lower voltage to the underlying source/drain region of second conductivity type;

means for connecting the first source/drain region which overlies the second conductivity type body region to the first source/drain region which overlies the first conductivity type body region to the first insulated gate electrode;

means for connecting the second source/drain region which overlies the second conductivity type body region to the second source/drain region which overlies the first conductivity type body region to the second insulated gate electrode; and first and second access transistors disposed, respectively, on the first and second source/drain regions which overlie a particular body region.

5. A device in accordance with claim 4, wherein:

the first and second access transistors are vertical IGFETs and are controlled by a common insulated gate electrode.

6. A device in accordance with claim 5, wherein:

the first and second source/drain regions which overlie a particular body region are isolated from each other by an isolation layer; and said common insulated gate electrode is disposed on said isolation layer.

7. A device in accordance with claim 2, further comprising:

means for connecting a source of predetermined voltage to the underlying source/drain region of first conductivity type;

means for connecting a source of relatively lower voltage to the underlying source/drain region of second conductivity type;

an input/output terminal, which connects the first source/drain region which overlies the second conductivity type body region to the first source/drain region which overlies the first conductivity type body region to the first insulated gate electrode; and a second input/output terminal, which connects the second source/drain region which overlies the second conductivity type body region to the second source/drain region which overlies the first conductivity type body region to the second insulated gate electrode.

8. A device in accordance with claim 2, further comprising:

means for connecting a source of predetermined voltage to the underlying source/drain region of first conductivity type;

means for connecting a source of relatively lower voltage to the underlying source/drain region of second conductivity type;

means for connecting the first source/drain region which overlies the second conductivity type body region to the first source/drain region which overlies the first conductivity type body region to the first insulated gate electrode;

means for connecting the second source/drain region which overlies the second conductivity type body region to the second source/drain region which overlies the first conductivity type body region to the second insulated gate electrode; and first and second access transistors disposed, respectively, on the first and second source/drain regions which overlie a particular body region.

9. A device in accordance with claim 8, wherein:

the first and second access transistors are vertical IGFETs and are controlled by a common insulated gate electrode.

10. A device in accordance with claim 9, wherein:

the first and second source/drain regions which overlie a particular body region are isolated from each other by an isolation layer; and said common insulated gate electrode is disposed on said isolation layer.

11. A device in accordance with claim 1, wherein the insulated gate electrode comprises:

an electrode of doped polycrystalline silicon which is substantially surrounded by insulation.

12. A device in accordance with claim 2, wherein the insulated gate electrode comprises:

an electrode of doped polycrystalline silicon which is substantially surrounded by insulation.

* * * * *